US006650883B1

(12) United States Patent
Stephane et al.

(10) Patent No.: US 6,650,883 B1
(45) Date of Patent: Nov. 18, 2003

(54) MIXER WITH ADJUSTABLE LINEARITY

(75) Inventors: Catala Stephane, Ismaning (DE);
Ganser Siegfried, Markt Schwaben (DE)

(73) Assignee: Infineon Technologies AG, Munich (DE)

( * ) Notice: Subject to any disclaimer, the term of this patent is extended or adjusted under 35 U.S.C. 154(b) by 475 days.

(21) Appl. No.: 09/606,527

(22) Filed: Jun. 30, 2000

(30) Foreign Application Priority Data

Jun. 30, 1999 (DE) .......................................... 199 30 152

(51) Int. Cl.[7] ............................. H04B 1/26; H04B 15/00
(52) U.S. Cl. ........................ 455/313; 327/113; 330/278
(58) Field of Search ................................ 455/323, 326, 455/325, 330, 333, 313; 327/355, 356, 351, 358, 113; 330/278, 254

(56) References Cited

U.S. PATENT DOCUMENTS

| 5,146,180 | A | * | 9/1992 | Hyakutake | .................. | 330/254 |
| 5,532,637 | A | | 7/1996 | Khoury et al. | .............. | 327/359 |
| 5,563,545 | A | | 10/1996 | Scheinberg | ................. | 327/389 |
| 5,625,307 | A | * | 4/1997 | Scheinberg | ................. | 327/113 |
| 5,826,182 | A | * | 10/1998 | Gilbert | ....................... | 455/326 |
| 6,054,899 | A | * | 4/2000 | Ke | .............................. | 330/278 |
| 6,316,996 | B1 | * | 11/2001 | Puotiniemi | .................. | 330/254 |
| 6,347,221 | B1 | * | 2/2002 | Tsukahara et al. | .......... | 455/333 |

FOREIGN PATENT DOCUMENTS

EP          0 774 832 A1       5/1997

OTHER PUBLICATIONS

"Steilheits–Multiplizierer" Lineare und Nichtlineare Analogrechenschaltungen, pp. 350–355.
A. Abidi, 1999 "Topics in Circuits for Communications CMOS Wireless Transceivers: The new Wave" IEEE Communications Magazine, Aug. 1999, pp. 119–124.
J. Rudell, 1997 "A 1.9–GHz Wide–Band IF Double Conversion CMOS Receiver for Cordless Telephone Applications" IEEE Journal of Solid–State Circuits, vol. 32, No. 12 Dec. 1997, pp. 2071–2088.

* cited by examiner

*Primary Examiner*—Dwayne Bost
*Assistant Examiner*—David Nguyen
(74) *Attorney, Agent, or Firm*—Morrison & Foerster LLP

(57) ABSTRACT

A four-quadrant multiplier for mixing RF signals comprises two differential amplifiers respectively connected as a load of a third differential amplifier. Both the negative feedback and the load of the third differential amplifier can be altered. Changing the negative feedback permits adjustment of the linearity range of the four-quadrant multiplier.

12 Claims, 2 Drawing Sheets

MIXER WITH ADJUSTABLE LINEARITY

This application is based on German priority application 19930152.2, which is hereby incorporated in its entirety by reference.

FIELD OF THE INVENTION

This invention relates generally to systems for mixing radio frequency ("RF") signals and more specifically to a four quadrant multiplier with an adjustable linearity range.

BACKGROUND OF THE INVENTION

Systems for mixing RF signals are known in the art. Typically, mixers are fed two RF signals. One signal is a received, modulated RF signal and the other signal is a local oscillator output RF signal having a fixed reference frequency. Certain types of such mixers are able to reduce the received, modulated RF signal to an intermediate frequency ("IF") signal. To achieve this result, the mixer must be adapted to accept both positive and negative signs for both RF signals. One such mixer is a four-quadrant multiplier, which can also referred to as a Gilbert cell. FIG. 2 shows a Gilbert cell of the type disclosed in U.S. Pat. No. 5,826,182. The Gilbert cell of FIG. 2 has three differential amplifiers: a first differential amplifier T1, T2 and a second differential amplifier T3, T4, respectively connected as a load of a third differential amplifier T7, T8.

The received, modulated RF signal is fed to the third differential amplifier T7, T8. More precisely, the signal is fed to the base terminals of the transistors T7, T8 of the third differential amplifier. The local oscillator output RF signal is fed to the base terminals of the transistors T1, T2 and T3, T4 of the first and second differential amplifiers, respectively. Alternatively, the received, modulated RF signal may be fed to the first and second differential amplifiers and the local oscillator output RF signal may be fed to the third differential amplifier. A current source I for the transistors T7, T8 is provided on the emitter side. The IF signal can then be tapped off at the summing points of the collectors of the cross-connected transistors T1, T2, T3, T4 of the first and second differential amplifiers.

Tietze, Schenk "Halbleiterschaltungstechnik" [Semiconductor Circuitry], 9th edition, Springer-Verlag, 1991, page 351 et seq., teaches the connection of the emitters of the transistors T7, T8 to a negative feedback resistor and the provision of respective current sources for each of the transistors T7, T8.

An important characteristic of such a four-quadrant multiplier is its linearity range. The linearity range of a four-quadrant multiplier refers to the voltage range of the input signals in which the multiplier exhibits a largely linear response. The linearity range required for the mixer depends on the nature of the application in which the mixer is being used. It is known that the linearity range of such a mixer may be adjusted externally by using additional resistors to increase the current. A Gilbert cell modified to include such resistors is shown in FIG. 3. The external resistors $R_{ext}$ are provided on the emitter side of the transistors T7, T8. A bias voltage $V_{BIAS1}$, for setting the operating point is applied to the control terminals of the transistors T7, T8. A bias voltage (not shown) for setting the operating point is similarly applied to the transistors T1, T2, T3, T4 of the first differential amplifier stage.

Certain problems arise when such external resistor circuitry is used to adjust the linearity range of the mixer. First, in modern applications, such as the integration and use of image frequency suppression mixers on integrated circuits, the output of a low noise amplifier ("LNA") is connected directly to the mixer input. Therefore, the reception signal amplified by the LNA no longer leaves the integrated circuit. In such circuits, the emitters of the transistors are not used as the input. Rather, the base terminals of the transistors are used as the input. Second, mixers incorporating such external resistor circuitry cannot be completely integrated with other circuits.

Therefore, there is a need to provide a four-quadrant multiplier with an adjustable linearity range. There is also a need to provide a four-quadrant multiplier with an adjustable linearity range that is adapted to be completely integrated with other circuits.

SUMMARY OF THE INVENTION

The present invention provides a four-quadrant multiplier with adjustable linearity. The multiplier comprises first and second differential amplifiers which are respectively connected as a load for a third differential amplifier. Control terminals of the first and second differential amplifiers are fed a first RF signal. Control terminals of the third differential amplifier are fed a second RF signal. In a preferred embodiment, the first RF signal is an RF signal at reference frequency from a local oscillator, and the second RF signal is an amplified, modulated reception signal.

At least one adjustable resistance element is provided between collectors of transistors of the first and second differential amplifiers. The adjustable resistance element may also or alternatively be provided between emitters of transistors of the third differential amplifier. The adjustable resistance element may also be provided between a current source and one of the emitters of the transistors of the third differential amplifier.

For example, the adjustable resistance element may be an adjustable negative feedback resistance element provided between the current source and one of the emitters of the transistors of the third differential amplifier. For another example, the adjustable resistance element may be an adjustable load change resistance element provided between the collectors of the transistors of the first and second differential amplifiers.

Some embodiments comprise both the adjustable negative feedback resistance element and the adjustable load change resistance element. In some of the embodiments, the present invention provides means for the synchronous switching of the adjustable negative feedback resistance element and the adjustable load change resistance element. Such means may comprise, for example, a bus which controls the synchronous switching.

In other embodiments which comprise both the adjustable negative feedback resistance element and the adjustable load change resistance element, one of the adjustable negative feedback resistance element and the adjustable load change resistance element is a p-channel resistor and the other of the adjustable negative feedback resistance element and the adjustable load change resistance element is an n-channel resistor.

Other embodiments comprise a fixed negative feedback resistance element that is not adjustable and that is provided between the current source and the emitters of the transistors of the third differential amplifier. The resistance of the adjustable resistance element may be changed continuously at least in a predetermined range. This is achieved, for example, by using with a transistor.

The present invention additionally provides a receiver for modulated RF signals comprising the four-quadrant multiplier in any of the embodiments described above, and wherein an amplified, modulated RF signal is fed to the control inputs of the first and second differential amplifiers through an LNA and a local oscillator output RF signal having a fixed reference frequency $F_{REF}$ is fed to the control inputs of the third differential amplifier. Alternately, the amplified, modulated RF signal is fed to the control inputs of the third differential amplifier through an LNA and the local oscillator output RF signal having a fixed reference frequency $F_{REF}$ is fed to the control inputs of the first and second differential amplifiers.

Further objects, features and properties of the present invention will become apparent from the detailed description of the preferred embodiment that follows with reference to the accompanying drawings.

DETAILED DESCRIPTION OF THE INVENTION

Figure 1:
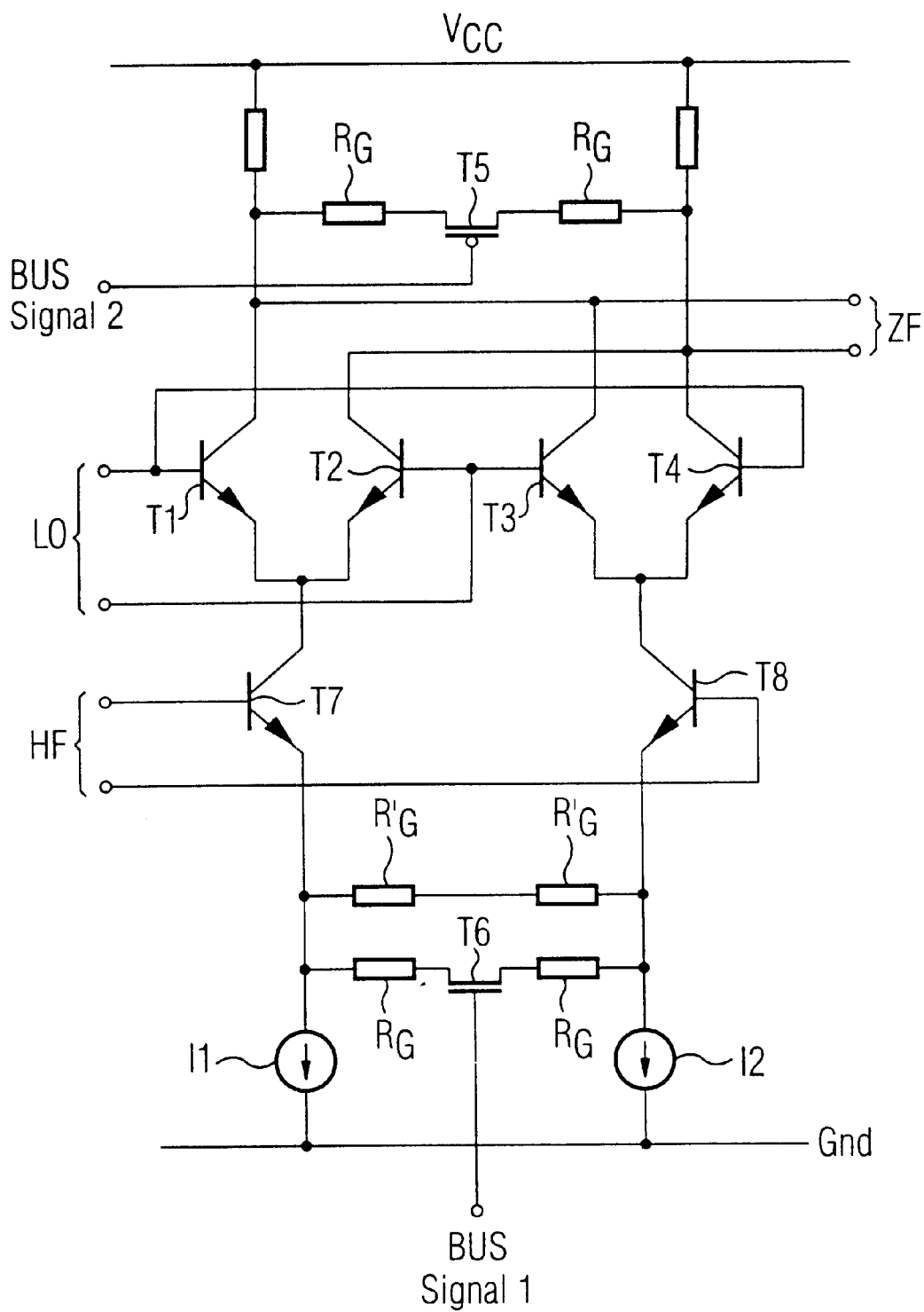
FIG. 1 is a circuit diagram illustrating a four quadrant multiplier according to the present invention.
Figure 2:
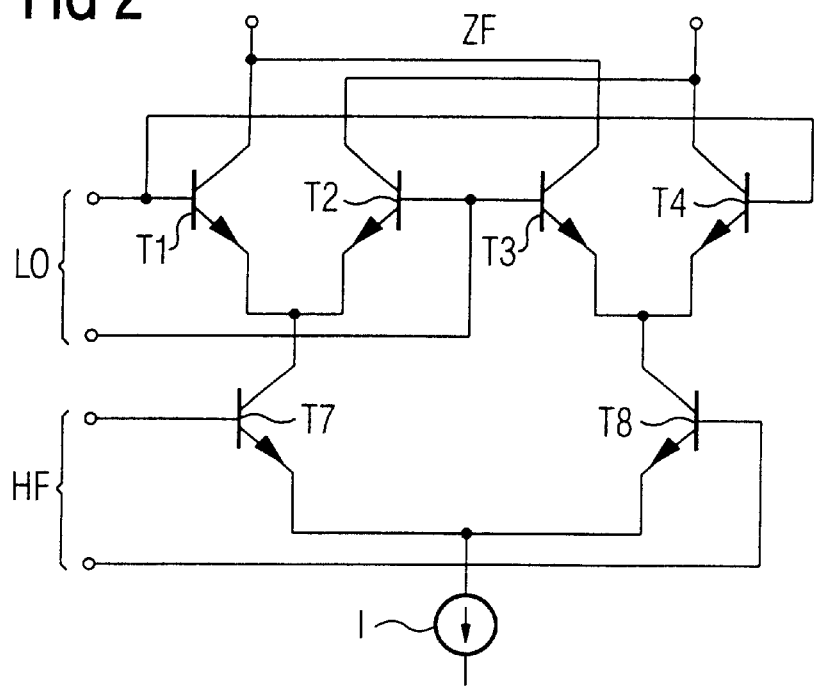
FIG. 2 is a circuit diagram illustrating a four-quadrant multiplier known as a Gilbert cell.
Figure 3:
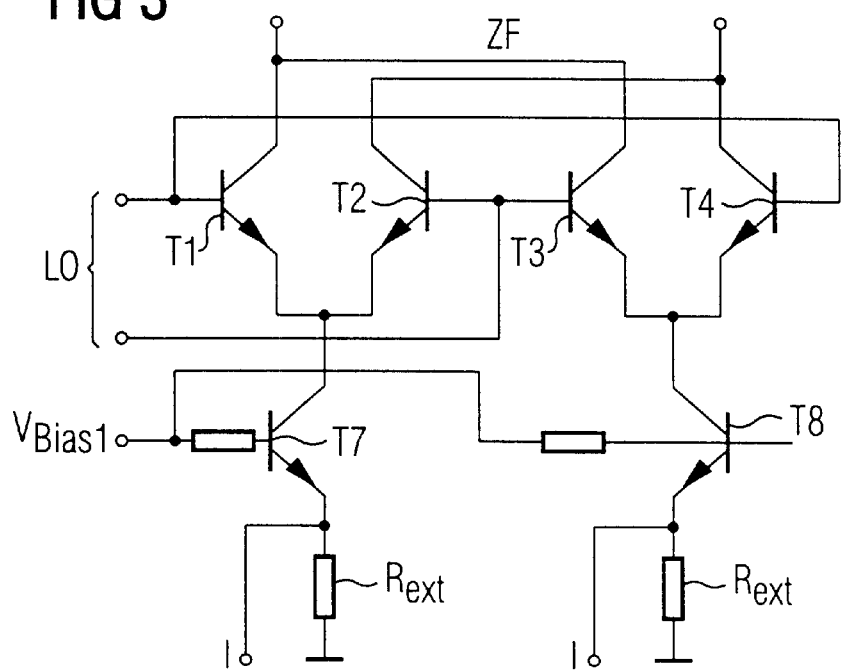
FIG. 3 is a circuit diagram illustrating a modified Gilbert cell.

Referring now to FIG. 1, the present invention provides in a preferred embodiment a four-quadrant multiplier comprising a first differential amplifier with transistors T1, T2 and a second differential amplifier with transistors T3, T4, said first and second amplifiers being respectively connected as a load of a third differential amplifier with transistors T7, T8.

A reference signal from a local oscillator ("LO") is fed to control inputs (more specifically, in the case of the bipolar transistors illustrated, to bases) of the transistors T1, T2, T3, T4 of the first and second differential amplifiers. By means of this reference signal, a received, modulated RF signal fed to control inputs of the transistors T7, T8 of the third differential amplifier is down-converted to an IF signal that is picked off at summing points of cross-connected collectors of the transistors T1, T3 and T2, T4, respectively.

A respective current source I1, I2 is connected between emitters of the transistors T7, T8 of the third differential amplifier and ground.

As illustrated in FIG. 1, internal resistance elements are provided at a plurality of points. Fixed negative feedback resistors $R_{G'}$, are provided between the emitters of the transistors T7, T8, respectively, and the current sources I1, I2, respectively. By choosing suitable resistances for the resistance elements $R_{G'}$ and the negative feedback generated thereby, it is possible to choose a predetermined linearity range for the mixer, for example, for a predetermined application.

To make the linearity range variable, and more particularly adjustable, for example, for different applications as an alternative or in addition to the fixed negative feedback resistance elements $R_{G'}$ an adjustable negative resistance element is provided in parallel therewith. This adjustable resistance element comprises a series circuit formed by resistors $R_G$ and a transistor T6. This transistor T6 may be an n-channel MOS-FET, for example. Switching the transistor T6 on or off selectively engages the negative feedback of the third differential amplifier T7, T8. By so changing the negative feedback, it is possible to choose the linearity range of the four-quadrant multiplier.

Additionally, an adjustable load change resistance element provided between the first and second amplifiers comprises a series circuit formed by resistors $R_G$ and transistor T5. More specifically, this adjustable load change resistance element is respectively connected between the collectors of the transistors T1, T2, T3, T4 of the first and second differential amplifiers and permits the adjustment of the gain. For example, in a CMOS implementation, the transistor T5 is a p-channel MOS-FET when the negative feedback switching transistor T6 is an n-channel MOS-FET.

The multiplier further comprises signals SIGNAL1, SIGNAL2 from a bus line BUS that drive the switching operation of the transistors T5, T6. The switching operation may, for example, be implemented and driven synchronously.

If the linearity range of the multiplier is enlarged by changing the negative feedback and the load of the respective transistors T5, T6, the noise behavior of the multiplier is simultaneously impaired.

The linearity range of the multiplier is enlarged when, in addition to the signal with a comparatively small amplitude, other signals with a large amplitude are also fed to the control inputs of the third differential amplifier T7, T8. For example, the linearity of the multiplier is enlarged in a GSM system when, in addition to the signal with a comparatively low amplitude, a blocker signal having a frequency close to that of the signal is fed at a very high amplitude to the control inputs of the transistors T7, T8 of the third differential amplifier. By increasing the linearity range of the multiplier, the correct processing of the useful signal (having a comparatively low amplitude) and the blocker signal (having a comparatively high amplitude) can be ensured. The multiplier should have a linear response, therefore, for both the high amplitude and the low amplitude.

In summary, the negative feedback can be varied by the n-channel transistor T6 driven via a three-conductor bus, for example, and the multiplier can thus be optimized for a specific applications.

Insofar as a transistor is used to switch the negative feedback and the load, a continuous switching operation can be implemented. That is, with regard to an analog switch, not only is it possible to switch between 0 and 1, but the value of the negative feedback can be altered continuously by correspondingly choosing the resistance of the transistor channel. In such a case, an analog control signal is fed to the transistors T5, T6, and the corresponding bus signal undergoes a digital-to-analog conversion by a D/A converter (not shown) before being fed to the control terminals of the transistors T5, T6.

Furthermore, insofar as the negative feedback resistance can be adjusted in a continuously variable manner (in contrast to prior devices which provide for only large adjustment jumps), at least over a specific range, it is possible to genuinely optimize the linearity range of the multiplier for specific applications. Consequently, the linearity range can be adjusted, for example, precisely to account for the differences between the input signals that are expected in a given application. This provides a significant advantage over switches having only an open position and a closed position.

To provide additional advantages, all of the resistance elements may be designed as integrated resistors.

The apparatus described and the method described allow signals which represent digital data streams to be filtered as desired with a minimum degree of complexity, irrespective of the details of the practical implementation.

Further variations and modifications of the foregoing will be apparent to those skilled in the art and are intended to be encompassed by the claims appended herewith.

We claim:

1. A four-quadrant multiplier for mixing RF signals, comprising:

first, second and third differential amplifiers, said first and second differential amplifiers being respectively connected as a load of said third differential amplifier;

a first RF signal being fed to control terminals of said first and second differential amplifiers; and a second RF signal being fed to control terminals of said third differential amplifier, wherein an adjustable negative feedback resistance element is respectively connected between a current source and emitters of transistors of said third differential amplifier, and an adjustable load change resistance element connects a collector side of said first differential amplifier to a collector side of said second differential amplifier.

2. The four-quadrant multiplier of claim 1, wherein said at least one resistance element is an adjustable negative feedback resistance element that is respectively connected between a current source and emitters of transistors of said third differential amplifier.

3. The four-quadrant multiplier of claim 1, wherein means are provided for synchronous switching of said adjustable negative feedback resistance element and said adjustable load change resistance element.

4. The four-quadrant multiplier of claim 3, wherein the synchronous switching of the adjustable negative feedback resistance element and of the adjustable load change resistance element is controlled by a bus said means comprises a bus that controls said synchronous switching.

5. The four-quadrant multiplier of claim 1, wherein one of said adjustable negative feedback resistance element and said adjustable load change resistance element is a p-channel transistor and the other of said adjustable negative feedback resistance element and said adjustable load change resistance element is an n-channel transistor.

6. The four-quadrant multiplier of claim 1, further comprising a fixed negative feedback resistance element respectively connected between a current source and emitters of transistors of said third differential amplifier.

7. The four-quadrant multiplier of claim 1, wherein a resistance of said at least one adjustable resistance element can be changed continuously at least in a predetermined range.

8. A receiver for modulated RF signals, comprising:

a four-quadrant multiplier for mixing RF signals, comprising:

first, second and third differential amplifiers, said first and second differential amplifiers being respectively connected as a load of said third differential amplifier;

a first RF signal being fed to control terminals of said first and second differential amplifiers; and a second RF signal being fed to control terminals of said third differential amplifier, wherein an adjustable negative feedback resistance element is respectively between a current source and emitters of transistors of said third differential amplifier; and an amplifier, wherein said first RF signal is one of a reference signal from a local oscillator and an amplified modulated RF signal from said amplifier and said second RF signal is the other of said reference signal from a local oscillator and said amplified modulated RF signal from said amplifier, and an adjustable load change resistance element connects a collector side of said first differential amplifier to a collector side of said second differential amplifier.

9. A four-quadrant multiplier for mixing RF signals, comprising:

first, second and third differential amplifiers, said first and second differential amplifiers being respectively connected as a load of said third differential amplifier;

a first RF signal being fed to control terminals of said first and second differential amplifiers; and a second RF signal being fed to control terminals of said third differential amplifier, wherein an adjustable negative feedback resistance element is respectively connected between a current source and emitters of said third differential amplifier, and wherein a fixed negative feedback resistance element is respectively connected in parallel to said adjustable negative feedback resistance element and is further connected between said current source and said emitters of said transistors of said third differential amplifier.

10. The four-quadrant multiplier according to claim 1, wherein said adjustable resistance element comprises a series connection of a first fixed resistor and a second fixed resistor and a transistor, said transistor being connected between said first and second fixed resistors.

11. The four-quadrant multiplier according to claim 9, wherein said adjustable resistance element comprises a series connection of a first fixed resistor and a second fixed resistor and a transistor, said transistor being connected between said first and second fixed resistors.

12. A receiver for modulated RF signals, comprising:

a four-quadrant multiplier for mixing RF signals, comprising:

first, second and third differential amplifiers, said first and second differential amplifiers being respectively connected as a load of said third differential amplifier;

a first RF signal being fed to control terminals of said first and second differential amplifiers; and a second RF signal being fed to control terminals of said third differential amplifier, wherein an adjustable negative feedback resistance element is respectively between a current source and emitters of transistors of said third differential amplifier; and an amplifier, wherein said first RF signal is one of a reference signal from a local oscillator and an amplified modulated RF signal from said amplifier and said second RF signal is the other of said reference signal from a local oscillator and said amplified modulated RF signal from said amplifier, and a fixed negative feedback resistance element is respectively connected in parallel to said adjustable negative feedback resistance element and is further connected between said current source and said emitters of said transistors of said third differential amplifier.

* * * * *